United States Patent [19]

Irani et al.

[11] Patent Number: 5,683,925

[45] Date of Patent: Nov. 4, 1997

[54] MANUFACTURING METHOD FOR ROM ARRAY WITH MINIMAL BAND-TO-BAND TUNNELING

[75] Inventors: Rustom F. Irani, Santa Clara; Reza Kazerounian, Alameda, both of Calif.; Mark Michael Nelson, Pocatello, Id.

[73] Assignees: Waferscale Integration Inc., Fremont, Calif.; American Microsystems, Inc., Pocatello, Id.

[21] Appl. No.: 665,150

[22] Filed: Jun. 13, 1996

[51] Int. Cl.⁶ .................................. H01L 21/8246
[52] U.S. Cl. .................. 437/45; 437/48; 148/DIG. 116
[58] Field of Search .......................... 437/45, 48, 56, 437/979, 985; 148/DIG. 116, DIG. 163

[56] References Cited

U.S. PATENT DOCUMENTS 5,308,781  5/1994  Ando et al. ............... 148/DIG. 116
5,470,774  11/1995  Kunitou ......................... 437/45
5,504,030  4/1996  Chung et al. .................... 437/45
5,580,809  12/1996  Mori et al. ..................... 437/48

*Primary Examiner*—Chandra Chaudhari
*Attorney, Agent, or Firm*—Skjerven, Morrill, MacPherson, Franklin & Friel

[57] ABSTRACT

A method of manufacturing a ROM array to minimize band-to-band tunneling is described. The method includes the steps of: a) implanting bit lines into the core area of a substrate as per a later-removed bit line mask, b) providing a ROM oxide layer over the entirety of the substrate, c) etching the ROM oxide layer only from the periphery area as per a later-removed core protect mask, d) providing a gate oxide layer over the entirety of the ROM array, e) laying down polysilicon rows in the core area as per a polysilicon mask and f) implanting a ROM implant into selected areas of the core area, thereby to produce turned off core transistors. The thickness of the gate oxide layer and the ROM oxide layer are independent of each other.

9 Claims, 8 Drawing Sheets

5,683,925

MANUFACTURING METHOD FOR ROM ARRAY WITH MINIMAL BAND-TO-BAND TUNNELING

FIELD OF THE INVENTION

The present invention relates to read only memory (ROM) arrays generally and to methods of manufacturing ROM arrays and to turning off selected ROM transistors without incurring significant, band-to-band leakage in particular.

BACKGROUND OF THE INVENTION

Read only memory (ROM) array chips are very well known in the art. The chips are formed of a ROM array core, comprising a multiplicity of ROM cells, and a periphery formed of control elements controlling the operation of the array core.

The ROM array stores programs and/or data in the form of bits, where a bit is either on (a logical value of 1) or off (a logical value of 0). Each bit is stored in a single cell, which is a single gain, n-channel transistor or ROM cell. A logical 0 is implemented with a transistor which has been shut off, such that it will not conduct when voltage is applied to it and a logical 1 is implemented with an active transistor which conducts when voltage is applied to it.

FIG. 1, to which reference is now made, illustrates a slice through a prior art ROM array chip showing one transistor 8 of the periphery, labeled 32, and two transistors 10 and 12 of the ROM array core, labeled 30, formed on a substrate 14. Transistor 8 and the other components of the periphery are formed separately from the transistors 10 and 12 of the ROM array. Periphery transistor 8 is formed of source and drain implants 4 and 5 and a polysilicon gate 20 and is surrounded by field oxide elements 6, which isolate transistor 8 from neighboring components. The gate 20 is formed above a gate oxide layer 2. The size, shape and thickness of the elements of the periphery transistor 8 may be determined, for example, by complementary metal oxide semiconductor (CMOS) periphery circuit requirements. For example, for a 0.8 µm CMOS technology, the gate oxide 2 is 150 Å, the dose for the $N^+$ implant 5 is $4 \times 10^{15}$ atoms/cm$^2$ and the thickness of the field oxide 6 is 6000 Å.

The transistors 10 and 12 are closer to each other than are neighboring components of the periphery. In fact, in the virtual ground ROM array of FIG. 1, the transistors 10 and 12 share diffusion bit lines 16 which act as the drain for one transistor and the source for the neighboring transistor. Between the bit lines 16, are channels 22. Other ROM architectures have the same problems as those described hereinbelow.

On top of the substrate 14 is a layer of oxide 18 on top or which is a row of polysilicon, also labeled 20. The layer of oxide is divided into columns (in the direction of the paper) of bit line oxides 18A, located on top of the bit lines 16, and gate oxides 18B, located on top of the channels 22 formed between the bit lines 16. The bit line oxides 18A are typically thicker than the gate oxides 18B. It is noted that the field oxide elements 6 are much thicker than the bit line oxides 18A. For example, in 0.8 µm technology, the bit line oxides 18A are typically 1000 Å and the field oxides 6 are typically 6000 Å.

Transistor 12 additionally has a dopant 24 implanted into its channel 22. This dopant, which is typically formed of Boron, raises the threshold voltage level Vth of the transistor 12 to above the standard activation voltage level such that, when the standard activation voltage is applied thereto, transistor 12 will not turn on. Transistor 12 thus stores a logical 0. This is not true of transistor 10 which has no extra dopant in its channel 22 and therefore, has a low threshold voltage of about 0.8V. Thus, transistor 10, which stores a logical 1, will turn on when the standard activation voltage is applied thereto.

Typically, the dopant 24 is implanted into the channel 22 of transistor 12 during a ROM implant process. This process may occur, for example, after the polysilicon layer 20 has been laid down. The desired concentration of dopant 24 is a function of the thickness of the gate oxide layer 18B, wherein the current trend is to reduce the thickness. The thinner the gate oxide layer 18B is, the higher the concentration of dopant 24 which is needed to bring the threshold voltage level Vth to close to the same voltage level. For example, if the desired voltage level is 5V, then a dose of $6 \times 10^{13}$ atoms/cm$^2$ of dopant is needed to produce a reasonable concentration (defined in atoms/cm$^3$) of dopant 24 for a gate oxide 18B of 150 Å. Similarly, a dose of $3.5 \times 10^{13}$ atoms/cm$^2$ is needed for a gate oxide 18B of 250 Å.

However, when the dopant 24, is present in large quantities such that the concentration in the channel is a few times $10^{18}$ atoms/cm$^3$, it causes "band-to-band" tunneling of current $I_{BB}$ from the bit line 16 to the substrate 14 of the transistor 12. If this leakage current is large enough (for example, at a level of 30 µA per bit line or 30 nA per cell in a 1 Mbit array with 1000 transistors on a bit line or half of that for a 4 Mbit array), it will cause all "0"s on this bit line look as though they were conducting "1"s. Furthermore virtual ground arrays such as is shown in FIG. 1, this band-to-band tunneling current can cause a high standby current $I_{SB}$. For example, for a 4 Mbit array, to maintain a standby current $I_{SB}$ of less than 1 µA, the maximum band-to-band tunneling current $I_{BB}$ per cell has to be less than 0.25 pA.

These two examples demonstrate a major problem in scaling (i.e. reducing the size of) ROM cells. As the ROM cells get smaller, the channels 22 become less wide and, in order to provide the same threshold voltage $V_T$, the gate oxide must be thinner. The thinner gate oxide forces a higher dosage for the "0" implant 24. The larger dosage, though, has more band-to-band tunneling current $I_{BB}$ per cell. In addition, the typically smaller scale ROM are utilized to create larger arrays and thus, the amount of band-to-band leakage in the entire array becomes able large vis-a-vis the desired standby current $I_{SB}$. Thus, due to the band-to-band tunneling current $I_{BB}$, the scaling requirements and standby current $I_{SB}$ requirements work against each other.

Reference is now made to FIGS. 2, 3 and 4 which illustrate the physics of the the band-to-band tunneling current $I_{BB}$ and its dependence on various parameters of the array.

FIG. 2 illustrates the band-to-band tunneling current $I_{BB}$ versus the implant dose into the channel 22, for a fixed bit line voltage $V_{BL}$ of 1.6V anti a fixed temperature T of 25° C. FIG. 2 indicates that the lower the channel implant close, the lower the band-to-band tunneling current $I_{BB}$.

FIG. 3 illustrates the bad-to-bail tun, ling current $I_{BB}$ versus the implant dose into the bit lines 16, for a fixed bit line voltage $V_{BL}$ of 1.6V and a fixed temperature T of 25° C. FIG. 3 indicates that the bit line implant also affects the band-to-band tunneling current $I_{BB}$ where, the lower the bit line implant dose, the lower the band-to-band tunneling current $I_{BB}$.

FIG. 4 illustrates the band-to-band tunneling current $I_{BB}$ versus the voltage $V_{BL}$ placed on the bit line. FIG. 4 has four curves, 26, 27, 28 and 29, one for each of four channel implant doses, $5.5 \times 10^{13}$, $9.0 \times 10^{13}$, $12.5 \times 10^{13}$ and $16.0 \times 10^{13}$, respectively. The curves 26–29 indicate that, for any given dosage level, as the bit line voltage $V_{BL}$ increases, the band-to-band tunneling current $I_{BB}$ increases. Specifically, the current $I_{BB}$ increases by more than an order of magnitude in response to an increase of 1V in the bit line voltage. Furthermore, at a given voltage level, an increase in the implant level causes an increase of a few orders of magnitude, in the current $I_{BB}$.

FIGS. 2, 3 and 4 indicate that the band-to-band tunneling current $I_{BB}$ is a function of the bit line voltage $V_{BL}$, the giant dosage level in the chanel and the bit line implant dosage level. As mentioned hereinabove, the implant dosage level has only recently become large due to the reduction in thickness of the gate oxide. Until the gate oxide became quite thin, the implant dosage was low enough that the band-to-band tunneling current $I_{BB}$ was low or non-existant. With the scaled down and larger ROM arrays of today, the band-to-band tunneling current $I_{BB}$ is significant.

SUMMARY OF THE PRESENT INVENTION

It is an object of the present invention to provide an improved manufacturing process for turning off ROM transistors which requires a lower ROM implant dose than in the prior art. The profess of the present invention does not affect the threshold voltage of the turned off, or logical 0, transistors.

Applicants have realized that the gate oxide thickness does not have to be consistent throughout the ROM array chip. Since the threshold voltage level depends on both the thickness of the gate oxide and on the doping level of the dopant in the channel, it is advantageous to have a thick gate oxide within the ROM array area, even if the gate oxides in the periphery are thinner.

Therefore, in accordance with a preferred embodiment of the present invention, the transistors in the ROM core area have thicker late oxides than those of the periphery circuit The present invention describes a method of manufacturing a ROM array to minimize band-to-band tunneling. The method includes the steps of: a) implanting bit lines into the core area of a substrate as per a later-removed bit line mask, b) providing a ROM oxide layer over the entirety of the substrate, c) etching the ROM oxide layer only from the periphery area as per a later-removed core protect mask, d) providing a gate oxide layer over the entirety of the ROM array, e) laying down polysilicon rows in the core area as per a polysilicon mask and f) implanting a ROM implant into selected areas of the core area, thereby to produce turned off core transistors.

Additionally, in accordance with a preferred embodiment of the present invention, the thickness of the gate oxide layer is dictated by the requirements of the periphery transistors independent of the thickness of the ROM oxide layer.

Moreover, in accordance with a preferred embodiment of the present invention, the thickness of the ROM oxide layer is dictated by the dosage level of the ROM implant which, in turn, is dictated by the maximal desired band-to-band tunneling current, independent of the thickness of the gate oxide layer.

Furthermore, in accordance with a preferred embodiment of the present invention, the method also includes the step of doping the periphery area to adjust the threshold level of only the periphery transistors therein. The step of doping utilizes the core protect mask.

Finally, in accordance with a preferred embodiment of the present invention, the ROM array is a virtual ground array and the steps of providing oxide layers can be either deposition or oxidation steps.

BRIEF DESCRIPTION OF THE DRAWINGS

The present invention will be understood and appreciated more fully from the following detailed description token in conjunction with the drawings in which.

DETAILED DESCRIPTION OF A PREFERRED EMBODIMENT

Figure 5A:
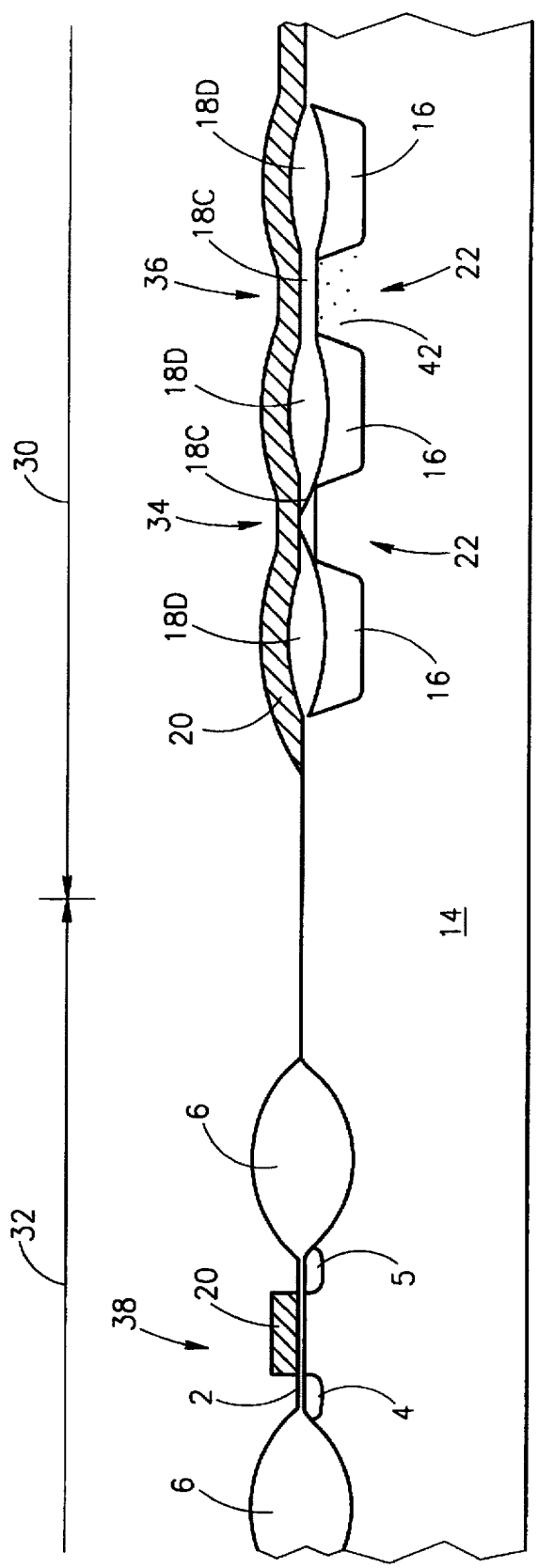
FIGS. 5A and 5B are cross-sectional views of a slice of a ROM array, constructed and operative in accordance with two alternative preferred embodiments of the present invention.
Figure 5B:
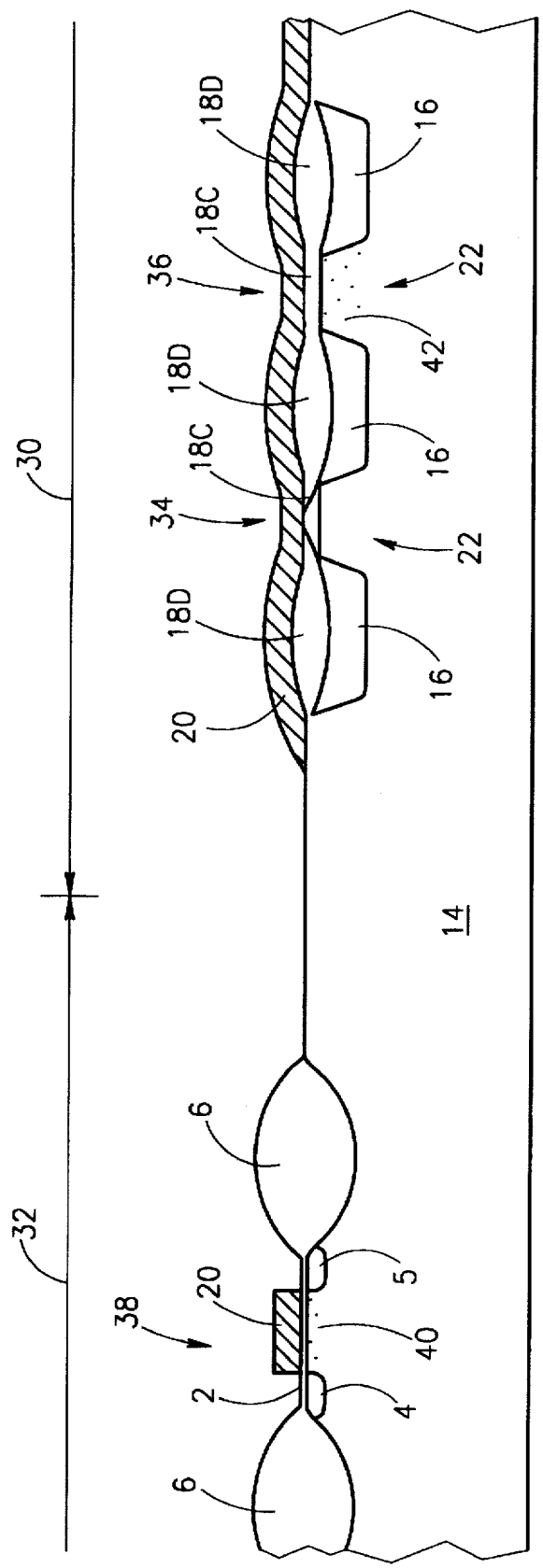

Reference is now made to FIGS. 5A and 5B which illustrate one slice of a ROM array, constructed and operative in accordance with two alternative preferred embodiments of the present invention, and to FIGS. 6A, 6B, 6C, 6D, 6E, 6F and 6G which illustrate the slice of FIGS. 5A and 5B at various stages during its manufacture.

Figure 1:
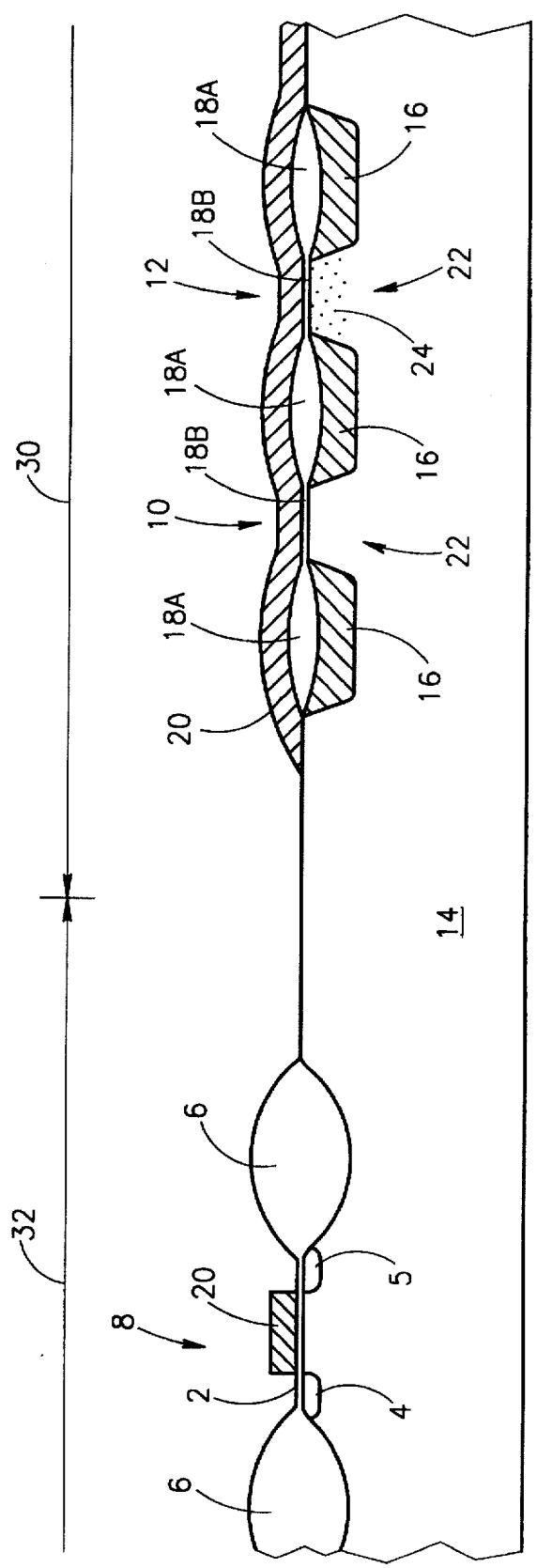
FIG. 1 is a cross-sectional view of a slice of the ROM chip including two prior art ROM transistors, one which is on and one which is off and a periphery transistor.
Figure 2:
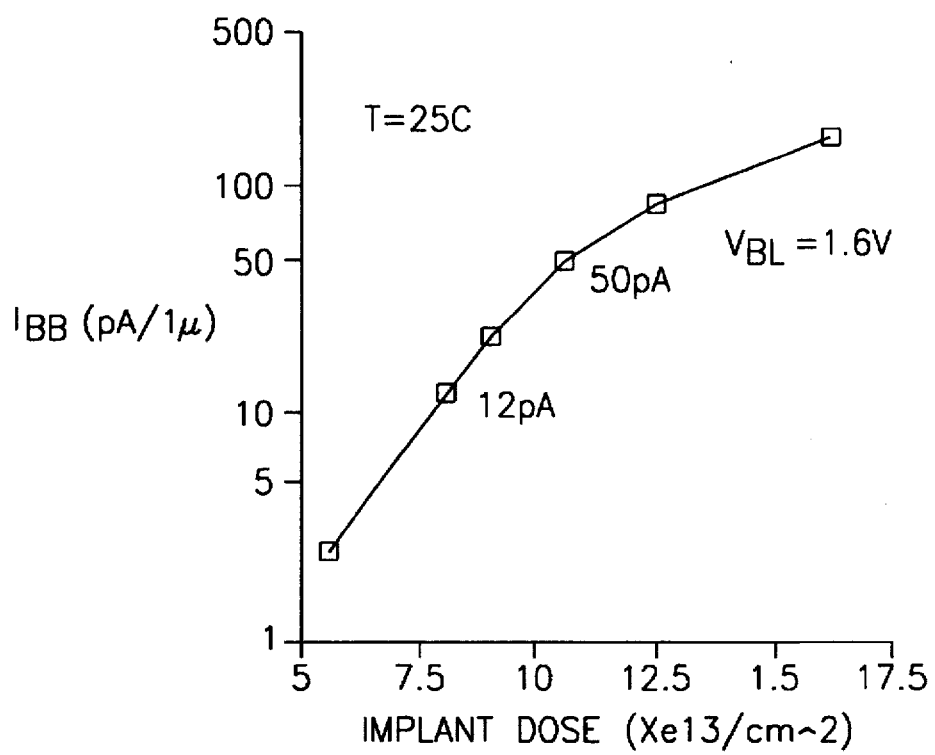
FIGS. 2, 3 and 4 are graphical illustrations of the band-to-band tunneling current versus various parameters.
Figure 3:
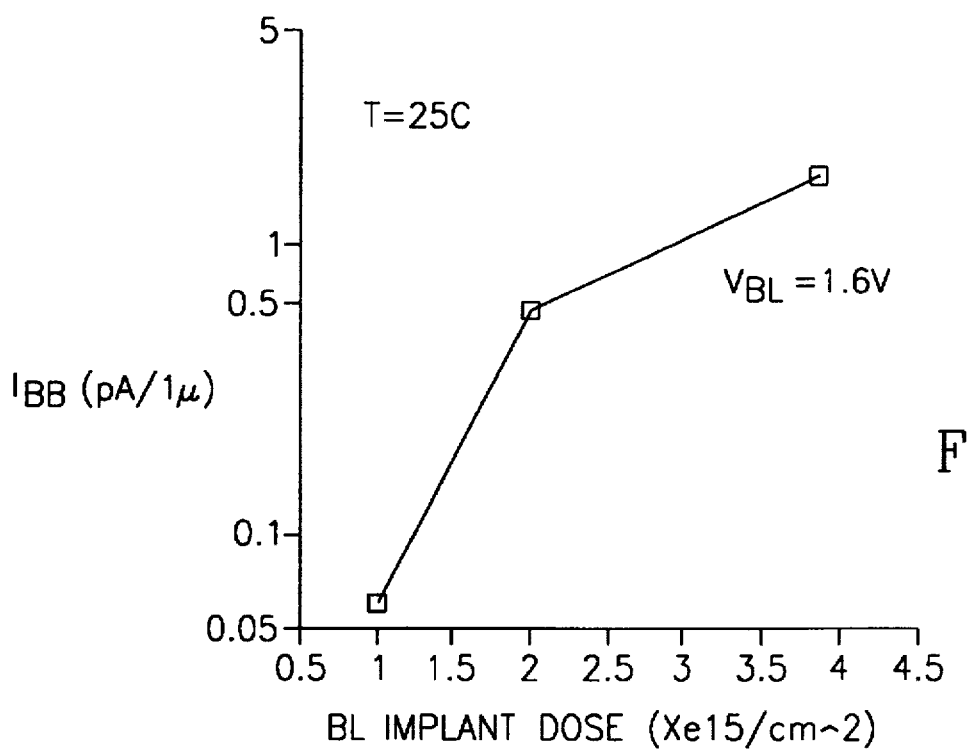
Figure 4:
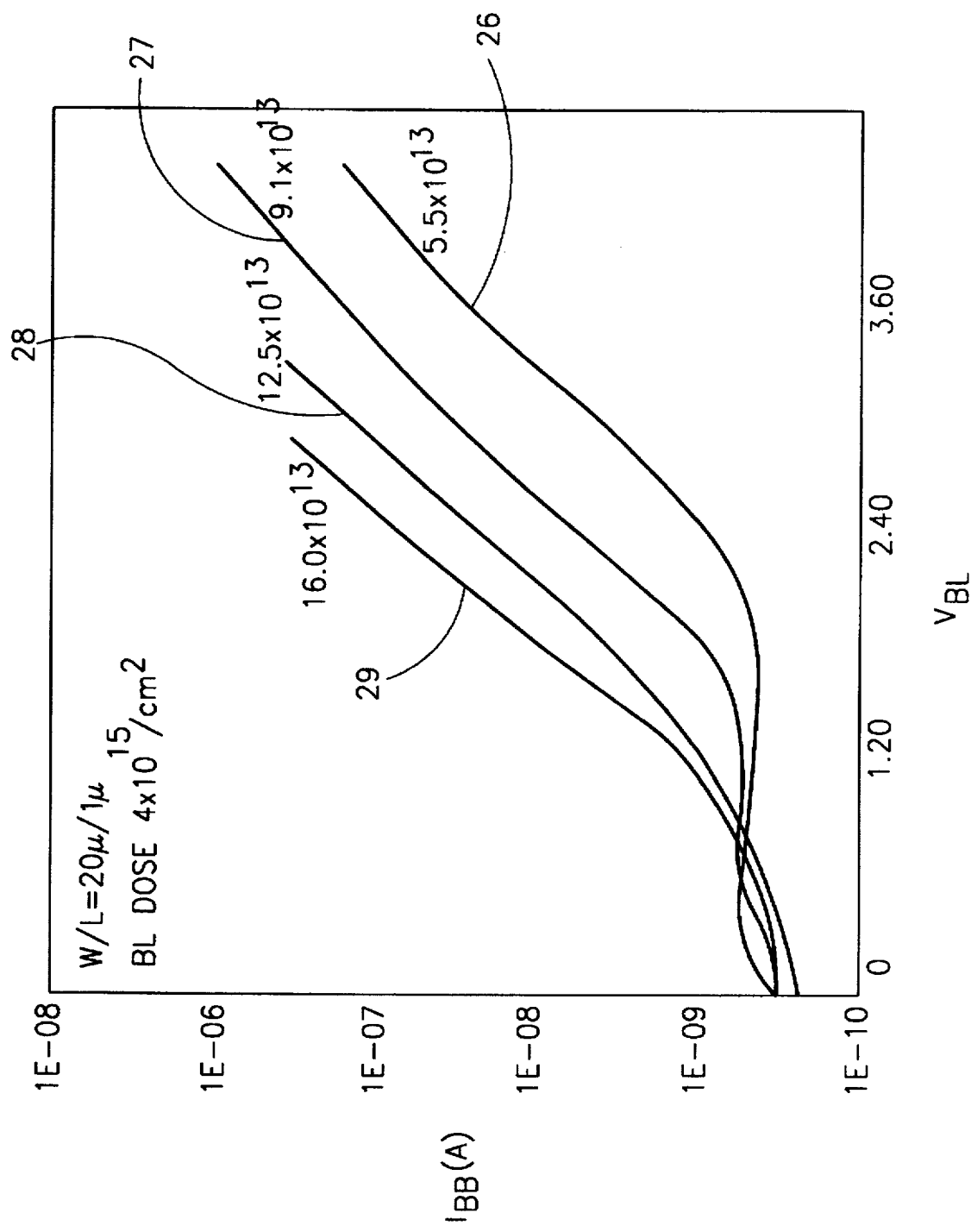

As in the slice of FIG. 1, the slice of FIG. 5A has the core area 30 surrounded by the periphery area 32. The core area 30 comprises a multiplicity of ROM transistors 34 some of whom, labeled 34, are turned on and some of whom, labeled 36, are turned off. The periphery area 32, as in the prior art, comprises a further multiplicity of components of which one, n-channel transistor 38 is shown. It will be appreciated that, without losing generality, the present invention can be implemented for p-channel devices and/or for non-virtual ground ROM arrays also.

As in the prior art, each ROM transistor 34 or 36 is formed of the channel 22 between two neighboring bit lines 16, the gate oxide 18 above the channel 22 and the polysilicon layer 20 above the gate oxide 18. Furthermore, as in the prior art, the core bit line oxides, labeled 18D, are thicket than the core gate oxides, labeled 18C.

However, in accordance with a preferred embodiment of the present invention, the oxide layer 18 of the core area 30 is thicker than the oxide layer 2 of the periphery 32. For example, the periphery gate oxide 2 might be 150 Å thick, the core gate oxide 18C might be 200 Å thick and the core bit line oxide 18D might be 1000 Å thick or thicker.

Due to the different thicknesses of the periphery gate oxide 2 and the core gate oxide 18C, the "natural" threshold voltages of the periphery transistor 38 and the on ROM transistors 34 are different, where that of the periphery transistors 38 is lower. For example, for a gate oxide 2 of 150 Å, the threshold voltage is 0.7V and for a gate oxide 18C of 250 Å, the threshold voltage is 1.0V. If desired, an implant 40 (FIG. 5B) of a first dosage can be implanted into the periphery transistor 38 to raise its threshold voltage to generally match that of the ROM transistors 34.

Due to the extra thickness of the core oxide layers 18, the amount of dopant 42 needed to shut off a core transistor 36 is less than in the prior art. This is illustrated in FIGS. 5A and 5B where the dopant 42 is less dense than that of dopant 24 of FIG. 1. The percentage reduction in the amount of dopant 42 needed is directly proportional to the percentage increase in thickness of the core gate oxide 18C over the periphery gate oxide 2. For example, for a gate oxide 2 of 150 Å, the dopant dose would be $6\times10^{13}$ atoms/cm$^2$ and for a gate oxide 18C of 250 Å the dopant dose is reduced to $3.5\times^{13}$ atoms/cm$^2$.

Since the band-to-band tunneling current is a function of at least the amount of dopant 42 in the channel, and since, in the present invention, there is less dopant in the channel, the array of the present invention has a significantly lower band-to-band tunneling current $I_{BB}$ than in the prior art. For example, if the prior art had a bit line voltage of 2V, a bit line implant dose of $1\times10^{15}$ atoms/cm$^2$ and a dopant dose of $9\times10^{13}$ atoms/cm$^2$ with a gate oxide of 150 Å, its band-to-band tunneling current $I_{BB}$ is 50 pA/cell. For the same bit line voltage and bit line implant dose, the present invention, with its thick gate oxide, has a dopant dose of $4.3\times10^{13}$ atoms/cm$^2$ and a band-to-band tunneling current $I_{BB}$ of 0.5 pA/cell.

It will be appreciated that the present invention decouples the periphery gate oxide thickness from the core gate oxide thickness. In the present invention, the periphery gate oxide thickness is determined by the requirements of the periphery circuitry and the core gate oxide thickness is determined by the desired low level of band-to-band tunneling current and the desired gate oxide breakdown level.

FIGS. 6A, 6B, 6C, 6D, 6E, 6F and 6G which illustrate the manufacturing process of the ROM array. In the following discussion, the process of etching a layer, which includes placing photoresist on the layer, placing a mask on the photoresist, etching wherever the mask is not and removing the photoresist, will not be detailed.

Specifically, the first process steps are the standard initial CMOS/NMOS/PMOS/BICMOS process steps, including Nwell and field oxidation, thereby producing field oxide 6 of the periphery. The ROM array process begins with a screen oxide 61 (FIG. 6A) over the entire chip, where the screen oxide 61 typically is grown to about 200 Å. It is noted that, as a result of the screen oxidation operation, the field oxides 6 become thicker, as shown.

Figure 6A:
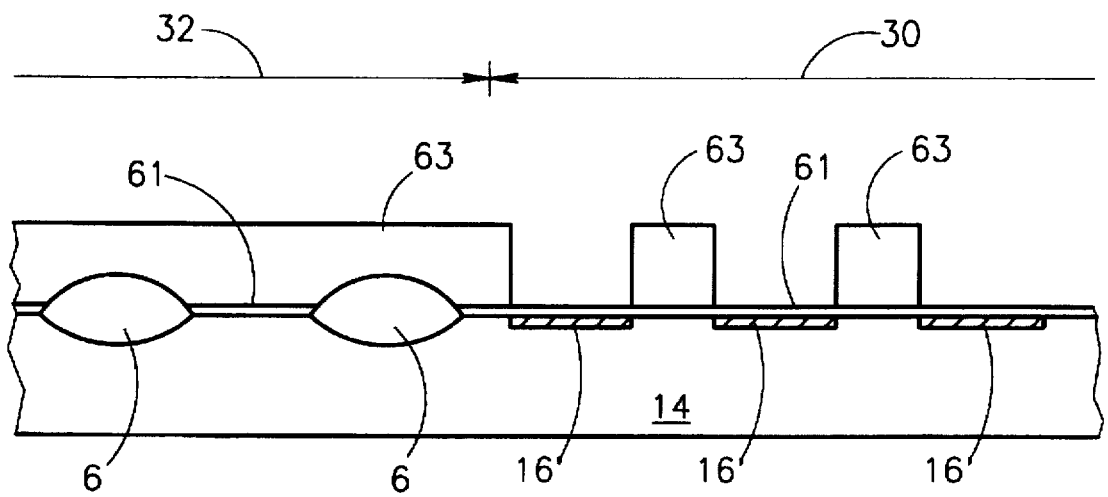
FIGS. 6A, 6B, 6C, 6D, 6E, 6F and 6G are cross-sectional views of the slice of FIG. 5 showing different stages of the manufacturing process.

The next step involves implanting precursors 16' to the bit lines 16 in accordance with a bit line mask 63 and is illustrated in FIG. 6A. As shown in FIG. 6A, the mask 63 blocks out the periphery area 32. The resist 63 lies on top of the screen oxide 61 which has been grown on the substrate 14. FIG. 6A shows that the bit lines 16' are implanted into the substrate 14 between the resist columns 63. The implant is typically arsenic (As) and the dosage and energy can be of any suitable level. For example, the dosage can be $1\times10^{15}$ atoms/cm$^2$ and the energy can be 80 KeV.

Figure 6B:
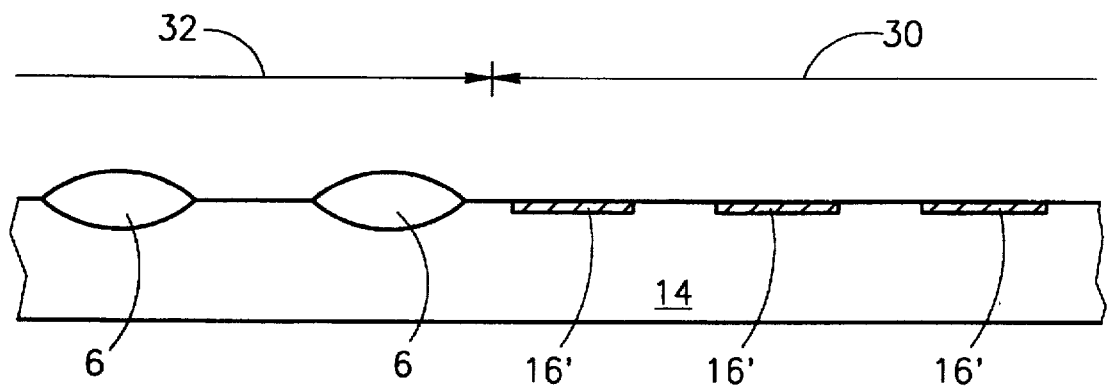

After bit line implant operation, the resist 63 and screen oxide 61 are removed, leaving a clear substrate surface in the core area 30 and slightly thinner field oxides 6 in the periphery area 32, as shown in FIG. 6B. Typically, a threshold adjustment operation is then performed on the entire array to ensure that every ROM transistor 34 and 36 has a desired threshold level, typically of 0.6–1.0V. This operation also provides an initial threshold level for the periphery transistors 38.

Figure 6C:
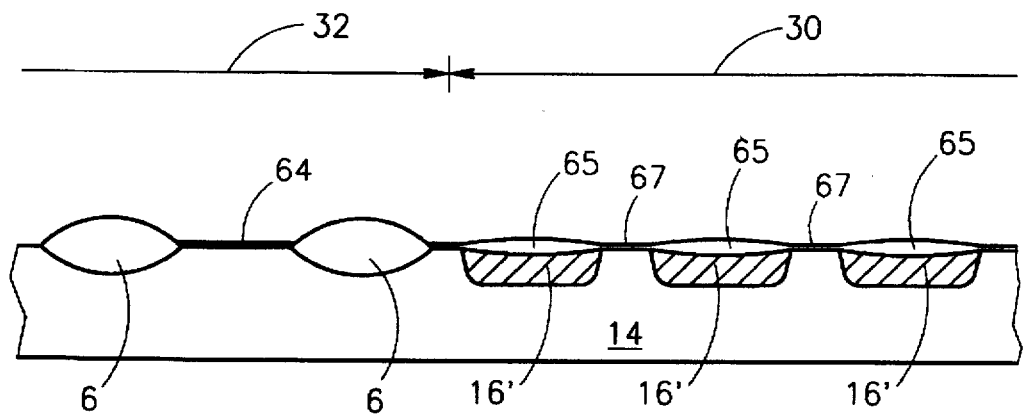

As shown in FIG. 6C, a ROM oxide layer is now grown over the entire chip producing thereby an oxide layer 64 between the field oxides 6, relatively thick oxide layers 65 over the precursor bit lines 16' and relatively thin oxide layers 67 between the relatively thick oxide layers 65. The enhanced oxidation over the precursor bit lines 16' is due to the high dose of the bit line implant which increases the oxidation rate.

The ROM oxide layer is typically of a thickness somewhat thicker than the difference between the desired thickness of the ROM gate oxide 18C and the periphery gate oxide 2. The exact thickness can be easily calculated based on the known oxidation equations. It depends on the oxidation temperature and the final delta in thickness between the periphery and core gate oxides. Alternatively, the ROM oxide layer can be slightly thicker. For example, the ROM oxide layer will be 150 Å thick to creata 150 Å thick periphery gate oxide versus a 250 Å core oxide. Typically, the oxide layers are grown at 850°–920° C. This oxidation step also diffuses the bit line 16' deeper.

Figure 6D:
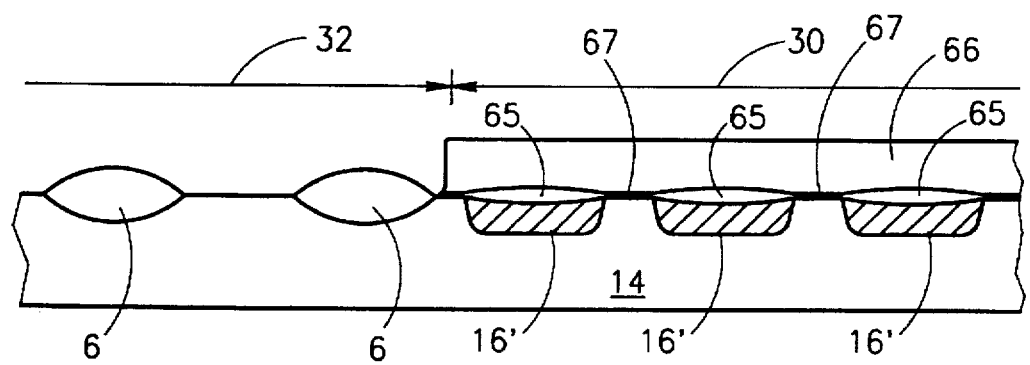
Figure 6E:
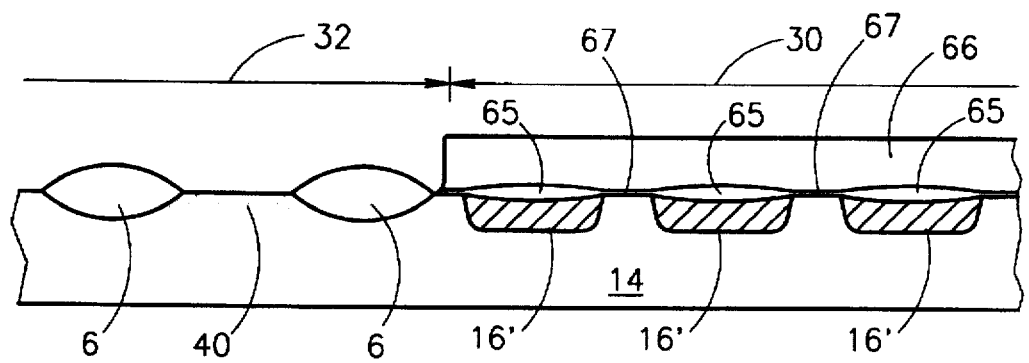

In accordance with a preferred embodiment of the present invention, a core protect mask 66 (FIG. 6D) is now laid down on the core area 30 to protect the core while the ROM oxide layer 64 is removed from the periphery with a wet etch. The oxide layers and 67 remain on the core 30 but the oxide layer 64 is removed from the periphery For the embodiment of FIG. 5B, core protect mask 66 is further utilized perform a further threshold adjustment operation, in which implant 40 is implanted, as illustrated in FIG. 6E. Implant 40 adjusts the threshold level of the periphery transistor 38 to the desired level for the periphery transistors. This step can be performed either before or after the wet etch of the ROM oxide layer 64.

Figure 6F:
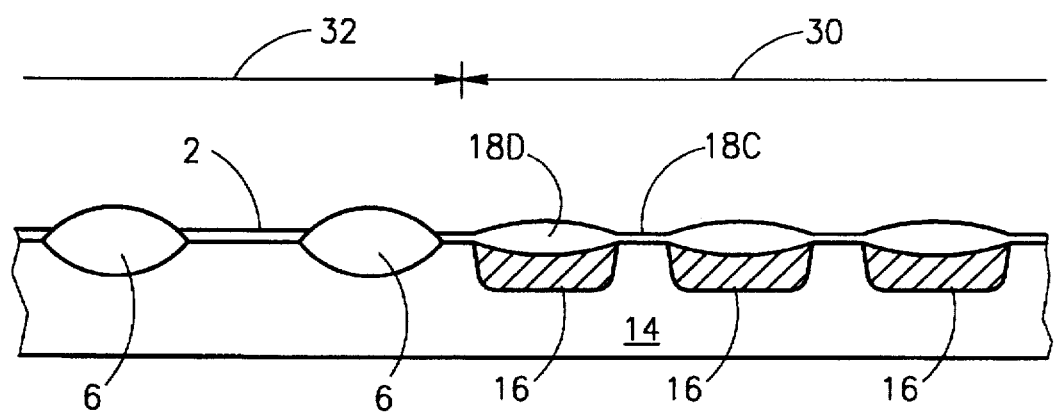
Figure 6G:
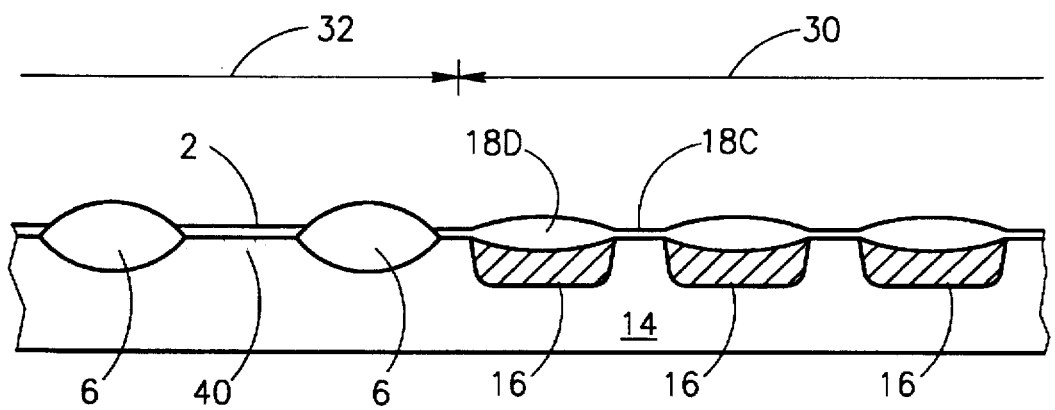

The core protect mask 66 is removed and a cleaning step is performed to remove any defect or residue on the current surface of the chip. A gate oxidation is then performed to grow a gate oxide layer on the entire array. FIG. 6F shows the results of the gate oxidation for the array of FIG. 6D and FIG. 6G shows the results for the alternative array of FIG. 6E. The gate oxidation step produces the periphery gate oxide 2 between the field oxides 6 of the periphery area 32 and increases the thickness of the oxide layers 65 and 67 of the core area 30, therby to produce the bit line oxide 18D and the core gate oxide 18C, respectively.

A suitable gate oxidation cycle is selected and a suitable thickness, such as 150 Å is chosen to conform to the CMOS/NMOS/PMOS/BICMOS circuit requirements of the periphery area 32. The precursor bit lines 16' are also deepened during this process, there by becoming the bit lines 16.

As has been mentioned hereinabove, the second, periphery gate oxide layer defines the thickness of the periphery gate oxide 2 (and is selected in accordance with the periphery circuit requirements) and the ROM oxide layers controls the thickness of the core gate oxides 18C (and is chosen in accordance with the desired maximal band-to-band tunneling current $I_{BB}$). Recall that the ROM oxide layer is slightly larger than the delta between the periphery gate oxide layer and the desired thickness of the core gate oxides 18C.

The processing of the array continues as in the prior art and includes laying down word lines 20 of polysilicon. At this point, the n-channel transistors 34 and 36 have been formed, but they are all on. A ROM implant mask is then laid down to protect those ROM transistors 34 which are to remain on as well as the entirety of the periphery 32. A ROM implant, typically of Boron B$^{11}$, is performed, implanting Boron into the ROM transistors 36, thereby shutting them off. The result is shown in FIG. 5A for the array without the implant 40 and in FIG. 5B for the array with the implant 40.

In accordance with a preferred embodiment of the present invention, the amount of ROM implant to be implanted is the amount necessary to raise the threshold voltage Vth of the off transistors 36 from the threshold level defined by the extra thick core gate oxides 18C to the shut off threshold volume level (e.g. 5V). This around of implant is less than in the prior art since the thicker gate oxide 18C provides a higher basic threshold voltage. As mentioned hereinabove, the criticality of using less Boron is that it reduces the band-to-band associated leakage current and other undesirable phenomena.

The remaining process steps are the standard POM back-end processing steps and include metallization and passivation.

It will be appreciated that the present invention can be implemented for non-virtual ground arrays, for p-channel transistors and for deposition type oxidation operations.

It will further be appreciated by persons skilled in the art that the present invention is not limited to what has been particularly shown and described hereinabove, Rather the scope of the present invention is defined only by the claims which follow:

We claim:

1. A method of manufacturing a read only memory (ROM) array with minimal band-to-band tunneling, the ROM array comprising a core area and a periphery area, the corn area having turned on and turned off core transistors and the periphery area having periphery transistors, the method comprising the steps of:
   implanting bit lines into said core area of a substrate as per a later-removed bit line mask;
   providing a ROM oxide layer over the entirety of said substrate;
   etching said ROM oxide layer only from said periphery area as per a later-removed core protect mask;
   providing a gate oxide layer over the entirety of said ROM array;
   laying down polysilicon rows in said core area as per a polysilicon mask; and
   implanting a ROM implant into selected areas of said core area, thereby to produce turned off core transistors.

2. A method according to claim 1 and wherein said thickness of said gate oxide layer is dictated by the requirements of the periphery transistors.

3. A method according to claim 1 and wherein said thickness layer is ROM oxide layer is dictated by the dosage level of said ROM implant which, in turn, is dictated by the maximal desired band-to-band tunneling current.

4. A method according to claim 1 and wherein said steps of providing oxide layers include the steps of growing said oxide layers.

5. A method according to claim 1 and wherein said steps of providing oxide layers include the steps of depositing said oxide layers.

6. A method according to claim 1 and wherein said ROM array is a virtual ground ROM array.

7. A method according to claim 1 and also including the step or doping the periphery area to adjust the threshold level of only the periphery transistors therein, said step of doping utilizing said core protect mask.

8. A method of manufacturing a read only memory (ROM) array with minimal band-to-band tunneling, the ROM array comprising a core area and a periphery area, the core area having turned on and turned off core transistors and the periphery area having periphery transistors, the method comprising the steps of:
   implanting bit lines into said core area of a substrate as per a later-removed bit line mask;
   providing a ROM oxide layer over the entirety of said substrate;
   etching said ROM oxide layer only from said periphery area as per a later-removed core protect mask;
   providing a gate oxide layer over the entirety of said ROM array whose thickness is dictated by the requirements of the periphery transistors;
   laying down polysilicon rows in said core area as per a polysilicon mask; and
   implanting a ROM implant into selected areas of said core area, thereby to produce turned off core transistors,
   wherein the thickness of said ROM oxide layer is dictated by the dosage level of said ROM implant which, in turn, is dictated by the maximal desired band-to-band tunneling current.

9. A method of manufacturing a read only memory (ROM) array with minimal band-to-band tunneling, the ROM array comprising a core area and a periphery area, the core area having turned on and turned off core transistors and the periphery area having periphery transistors, the method comprising the steps of:
   implanting bit lines into said core area of a substrate as per a later-removed bit line mask;
   providing a ROM oxide layer over the entirety of said substrate;
   etching said ROM oxide layer only from said periphery area as per a later-removed core protect mask;
   providing a gate oxide layer over the entirety of said ROM array;
   laying down polysilicon rows in said core area as per a polysilicon mask; and
   implanting a ROM implant into selected areas of said core area, thereby to produced turned off core transistors,
   wherein the thickness of said ROM oxide layer is dictated by the dosage level of said ROM implant which, in turn, is dictated by the maximal desired band-to-band tunneling current.

* * * * *